US010106713B2

(12) United States Patent
Tagami et al.

(10) Patent No.: US 10,106,713 B2
(45) Date of Patent: Oct. 23, 2018

(54) WAFER PROCESSING LAMINATE, TEMPORARY ADHESIVE MATERIAL FOR WAFER PROCESSING, AND METHOD FOR MANUFACTURING THIN WAFER

(71) Applicant: SHIN-ETSU CHEMICAL CO., LTD., Tokyo (JP)

(72) Inventors: Shohei Tagami, Annaka (JP); Michihiro Sugo, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 19 days.

(21) Appl. No.: 15/110,576

(22) PCT Filed: Jan. 21, 2015

(86) PCT No.: PCT/JP2015/000253
§ 371 (c)(1),
(2) Date: Jul. 8, 2016

(87) PCT Pub. No.: WO2015/115060
PCT Pub. Date: Aug. 6, 2015

(65) Prior Publication Data
US 2016/0326414 A1 Nov. 10, 2016

(30) Foreign Application Priority Data

Jan. 29, 2014 (JP) .................. 2014-014348

(51) Int. Cl.
*B32B 27/28* (2006.01)
*C09J 183/04* (2006.01)
*C09J 183/10* (2006.01)
*C09J 183/14* (2006.01)
*C08L 83/04* (2006.01)
*H01L 21/683* (2006.01)
*H01L 21/02* (2006.01)
*H01L 21/304* (2006.01)
*C08G 77/12* (2006.01)
*C08G 77/04* (2006.01)
*C08G 77/50* (2006.01)

(52) U.S. Cl.
CPC ........... *C09J 183/04* (2013.01); *B32B 27/283* (2013.01); *C08L 83/04* (2013.01); *C09J 183/10* (2013.01); *C09J 183/14* (2013.01); *H01L 21/02255* (2013.01); *H01L 21/304* (2013.01); *H01L 21/6835* (2013.01); *C08G 77/04* (2013.01); *C08G 77/12* (2013.01); *C08G 77/50* (2013.01); *C09J 2203/326* (2013.01); *H01L 2221/00* (2013.01); *H01L 2221/6834* (2013.01); *H01L 2221/68318* (2013.01); *H01L 2221/68327* (2013.01); *H01L 2221/68386* (2013.01)

(58) Field of Classification Search
None
See application file for complete search history.

(56) References Cited

U.S. PATENT DOCUMENTS

| 7,541,264 | B2 | 6/2009 | Gardner et al. |
| 2005/0233547 | A1 | 10/2005 | Noda et al. |
| 2007/0212819 | A1 | 9/2007 | Tamura et al. |
| 2008/0090380 | A1 | 4/2008 | Gardner et al. |
| 2012/0175045 | A1 | 7/2012 | Furuya et al. |
| 2013/0108866 | A1* | 5/2013 | Kato ...................... C08G 77/52 |
| | | | 428/354 |
| 2013/0220687 | A1* | 8/2013 | Tagami ...................... C09J 7/00 |
| | | | 174/259 |
| 2013/0280886 | A1 | 10/2013 | Kato et al. |
| 2014/0057450 | A1 | 2/2014 | Bourbina et al. |

FOREIGN PATENT DOCUMENTS

| CN | 1155562 A | 7/1997 |
| JP | 2004-064040 A | 2/2004 |
| JP | 2006-328104 A | 12/2006 |
| JP | 2013-110391 A | 6/2013 |
| JP | 2013-243350 A | 12/2013 |
| KR | 10-2009-0065156 A | 6/2009 |
| TW | 201241897 A | 10/2012 |
| TW | I397131 B | 5/2013 |
| TW | 201335321 A | 9/2013 |
| TW | 201400578 A | 1/2014 |

OTHER PUBLICATIONS

Aug. 25, 2017 Extended Search Report issued in European Patent Application No. 15743005.9.
Translation of Apr. 21, 2015 Search Report issued in International Patent Application No. PCT/JP2015/000253.
Feb. 5, 2018 Office Action issued in Chinese Application No. 201580006451.9.
Mar. 14, 2018 Search Report in Taiwanese Application No. 104102908.

* cited by examiner

*Primary Examiner* — Marc S Zimmer
(74) *Attorney, Agent, or Firm* — Oliff PLC

(57) ABSTRACT

A wafer processing laminate including a support, a temporary adhesive material layer formed on the support, and a wafer, having a circuit-forming front surface and back surface to be processed, laminated on the temporary adhesive material layer, in which the temporary adhesive material layer is composed of a complex temporary adhesive material layer having a three-layered structure including a first temporary adhesive layer composed of a thermoplastic organopolysiloxane polymer layer releasably adhering to the front surface of the wafer, second temporary adhesive layer composed of thermosetting siloxane-modified polymer layer releasably laminated on the first temporary adhesive layer, and third temporary adhesive layer composed of thermosetting siloxane polymer layer releasably laminated on the second temporary adhesive layer and releasably adhering to the support. A temporary adhesive material for a wafer processing facilitates temporary adhesion and separation, and allows separation even when a thin wafer is cut before separation.

21 Claims, 1 Drawing Sheet

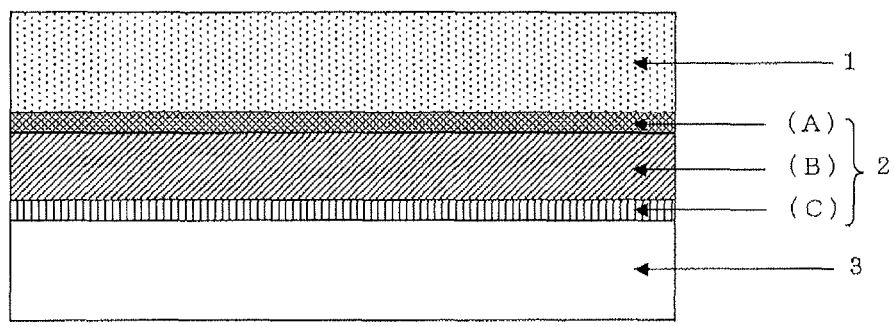

WAFER PROCESSING LAMINATE, TEMPORARY ADHESIVE MATERIAL FOR WAFER PROCESSING, AND METHOD FOR MANUFACTURING THIN WAFER

TECHNICAL FIELD

The present invention relates to a wafer processing laminate that enables a thin wafer to be obtained effectively, a temporary adhesive material for a wafer processing, and a method for manufacturing a thin wafer.

BACKGROUND ART

Three-dimensional semiconductor mounting has become essential for higher density and larger capacity. The three-dimensional mounting technique is a semiconductor production technique for thinning a semiconductor chip and connecting the chip to another chip by a through silicon via (TSV) to form a multilayer. To realize this technique, steps of grinding a non-circuit-forming surface (also referred to as "back surface") of a substrate on which a semiconductor circuit has been formed to thin the substrate, and then forming an electrode including a TSV on the back surface, are required. In the step of grinding the back surface of a silicon substrate, a protective tape for the back surface is conventionally attached to a surface opposite to the surface to be ground to prevent the wafer from breaking during grinding. However, this tape uses an organic resin film as the base material, which has flexibility, but inadequate strength and heat resistance. Thus, this tape is not suited to the steps of forming a TSV and forming a wiring layer on the back surface.

In this context, there has been proposed a system in which a semiconductor substrate is bonded to a support made of silicon, glass or the like, through an adhesive layer to sufficiently withstand the steps of grinding the back surface and forming a TSV and an electrode on the back surface. In this system, the adhesive layer used for bonding the substrate to the support is important. The adhesive layer requires a sufficient durability to bond the substrate and the support without gaps and to withstand subsequent steps, and also requires an ability to easily detach a thin wafer from the support finally. The adhesive layer, which is finally removed, is hence referred to herein as "temporary adhesive layer" (or temporary adhesive material layer).

With respect to the conventionally known temporary adhesive layer and a method for removing this layer, the following techniques have been proposed: high intensity light is irradiated to an adhesive material containing a light-absorbing substance to decompose the adhesive material layer whereby the adhesive material layer is removed from the support (Patent Literature 1); a heat fusible hydrocarbon compound is used for the adhesive material, and bonding and removal are carried out in a heat-molten state (Patent Literature 2). The former technique has problems of requiring expensive tools such as laser, and a long treatment time per substrate. The latter technique is simple because of control only by heat, but thermal stability is insufficient at a high temperature exceeding 200° C., and thus the applicable range is limited. Furthermore, these temporary adhesive layers are not adequate to form a film with uniform thickness on a heavily stepped substrate and to provide a complete adhesion to the support.

Besides, it has been proposed to use a silicone adhesive for the temporary adhesive material layer (Patent Literature 3). In this technique, a substrate is bonded to a support with an addition-curable silicone adhesive, and on the removal, the assembly is immersed in a chemical solution capable of dissolving or decomposing the silicone resin to separate the substrate from the support. Thus, this method takes a very long time for separation and is difficultly applied to the actual manufacturing process.

CITATION LIST

Patent Literature

PATENT LITERATURE 1: Japanese Patent Laid-Open Publication No. 2004-64040
PATENT LITERATURE 2: Japanese Patent Laid-Open Publication No. 2006-328104
PATENT LITERATURE 3: U.S. Pat. No. 7,541,264

SUMMARY OF INVENTION

Technical Problem

The present invention was accomplished in view of the above-described problems. It is an object of the present invention to provide a wafer processing laminate and a temporary adhesive material for a wafer processing which facilitate temporary adhesion, allow formation of the layer with uniform film thickness on a heavily stepped substrate, are highly compatible with the steps of forming a TSV and forming a wiring on the back surface of the wafer, have excellent resistance to a thermal process for wafer such as chemical vapor deposition (CVD), allow easy separation even when a thin wafer is cut before separation, and can increase productivity of thin wafers, and further provide a method for manufacturing a thin wafer using the same.

Solution to Problem

To accomplish the object, the present invention provides a wafer processing laminate comprising a support, a temporary adhesive material layer formed on the support, and a wafer laminated on the temporary adhesive material layer, the wafer having a front surface on which a circuit is formed and a back surface to be processed, wherein the temporary adhesive material layer comprises a complex temporary adhesive material layer having a three-layered structure that includes a first temporary adhesive layer composed of a thermoplastic organopolysiloxane polymer layer (A) releasably adhering to the front surface of the wafer, a second temporary adhesive layer composed of a thermosetting siloxane-modified polymer layer (B) releasably laminated on the first temporary adhesive layer, and a third temporary adhesive layer composed of a thermosetting siloxane polymer layer (C) releasably laminated on the second temporary adhesive layer and releasably adhering to the support.

Such a wafer processing laminate allows formation of the layer with uniform film thickness on a heavily stepped substrate, is highly compatible with the steps of forming a TSV and forming a wiring on the back surface of the wafer, and has excellent resistance to a thermal process such as CVD, allows easy separation even when the thin wafer is cut before separation, and can increase productivity of the thin wafers.

The thermoplastic organopolysiloxane polymer layer (A) is preferably formed on a partial surface of the wafer and releasably adheres to the partial surface.

The wafer processing laminate including such a polymer layer (A) allows the thermosetting siloxane-modified polymer layer (B) to be partially directly laminated on the circuit-formed wafer, and thus reduces the risk that separation occurs at the time of processing the circuit-formed wafer.

Furthermore, the present invention provides a temporary adhesive material for a wafer processing, the temporary adhesive material being used for temporarily bonding a support and a wafer having a front surface on which a circuit is formed and a back surface to be processed, comprising a complex temporary adhesive material layer having a three-layered structure that includes a first temporary adhesive layer composed of a thermoplastic organopolysiloxane polymer layer (A) capable of releasably adhering to the front surface of the wafer, a second temporary adhesive layer composed of a thermosetting siloxane-modified polymer layer (B) releasably laminated on the first temporary adhesive layer, and a third temporary adhesive layer composed of a thermosetting siloxane polymer layer (C) releasably laminated on the second temporary adhesive layer and capable of releasably adhering to the support.

Such a temporary adhesive material for a wafer processing facilitates temporary adhesion between the wafer and the support, allows formation of the layer with uniform film thickness on a heavily stepped substrate, is highly compatible with the steps of forming a TSV and forming a wiring on the back surface of the wafer, has excellent resistance to a thermal process such as CVD, allows easy separation even when the thin wafer is cut before separation, and can increase productivity of the thin wafers.

A peripheral portion of the thermoplastic organopolysiloxane polymer layer (A) is preferably partially removed.

When the temporary adhesive material for a wafer processing including such a polymer layer (A) is used as the temporary adhesive material layer of the wafer processing laminate, the thermosetting siloxane-modified polymer layer (B) is directly laminated on the peripheral portion of the circuit-formed wafer. This reduces the risk that separation occurs at the time of processing the circuit-formed wafer.

In these aspects, the thermoplastic organopolysiloxane polymer layer (A) is preferably a layer of an unreactive organopolysiloxane containing 99.000 to 99.999 mol % of a siloxane unit (D unit) shown by $R^{11}R^{12}SiO_{2/2}$, 1.000 to 0.001 mol % of a siloxane unit (M unit) shown by $R^{13}R^{14}R^{15}SiO_{1/2}$, and 0.000 to 0.500 mol % of a siloxane unit (T unit) shown by $R^{16}SiO_{3/2}$, where $R^{11}$, $R^{14}$, $R^{15}$, and $R^{16}$ each represent an unsubstituted or substituted monovalent hydrocarbon group, the unreactive organopolysiloxane having a weight average molecular weight of 200,000 to 1,000,000 and containing 0.5 mass % or less of a low molecular weight component having a molecular weight of 740 or less.

Such a thermoplastic organopolysiloxane polymer layer (A) is excellent in adhesiveness and heat resistance, and thus preferable.

Moreover, the thermosetting siloxane-modified polymer layer (B) is preferably a cured layer of a composition containing 100 parts by mass of a siloxane bond-containing polymer having a repeating unit shown by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

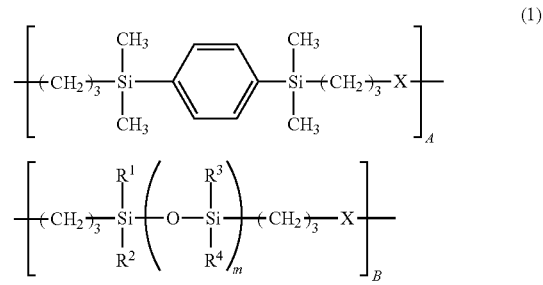

wherein $R^1$ to $R^4$ may be the same or different, and represent a monovalent hydrocarbon group having 1 to 8 carbon atoms; "m" is an integer of 1 to 100; B is a positive number; A is 0 or a positive number; and X is a divalent organic group shown by the following general formula (2),

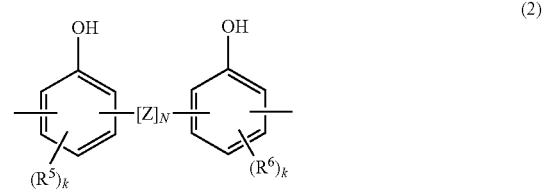

wherein Z represents a divalent organic group selected from any of

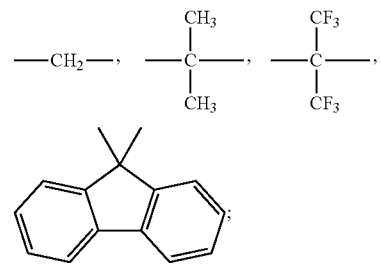

N represents 0 or 1; $R^5$ and $R^6$ each represent an alkyl or alkoxy group having 1 to 4 carbon atoms, and may be the same or different from each other; and "k" represents any of 0, 1, and 2.

Such a thermosetting siloxane-modified polymer layer (B) is more excellent in heat resistance, and thus preferable.

Moreover, the thermosetting siloxane-modified polymer layer (B) is preferably a cured layer of a composition containing 100 parts by mass of a siloxane bond-containing polymer having a repeating unit shown by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

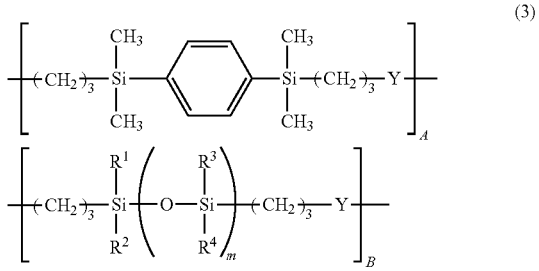

(3)

(wherein $R^1$ to $R^4$ may be the same or different, and represent a monovalent hydrocarbon group having 1 to 8 carbon atoms; "m" is an integer of 1 to 100; B is a positive number; A is 0 or a positive number; and Y is a divalent organic group shown by the following general formula (4),

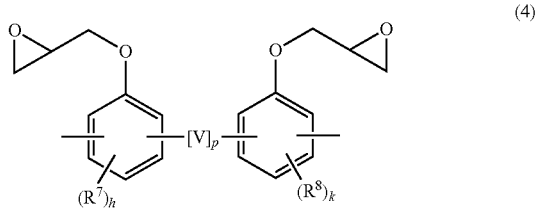

(4)

wherein V represents a divalent organic group selected from any of

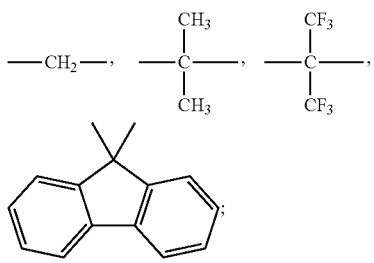

"p" represents 0 or 1; $R^7$ and $R^8$ each represent an alkyl or alkoxy group having 1 to 4 carbon atoms, and may be the same or different from each other; and "h" represents any of 0, 1, and 2.

Such a thermosetting siloxane-modified polymer layer (B) is more excellent in heat resistance, and thus preferable.

Moreover, the thermosetting siloxane polymer layer (C) is preferably a cured layer of a composition containing:
(C-1) an organopolysiloxane having two or more alkenyl groups per molecule;
(C-2) an organohydrogenpolysiloxane having two or more silicon-bonded hydrogen atoms (Si—H groups) per molecule, in such an amount that a mole ratio of the Si—H group in the component (C-2) to the alkenyl group in the component (C-1) ranges from 0.3 to 10; and
(C-3) a platinum-based catalyst.

Such a thermosetting siloxane polymer layer (C) is more excellent in CVD resistance, and thus preferable.

The thermosetting siloxane polymer layer (C) preferably further contains (C-4) a reaction retarder in an amount of 0.1 to 10 parts by mass based on 100 parts by mass of a total of the component (C-1) and the component (C-2).

Such a thermosetting siloxane polymer layer (C) can prevent the solution to be treated (i.e. the composition) from thickening and gelling before heat curing.

Moreover, the thermosetting siloxane-modified polymer layer (B) laminated on the thermosetting siloxane polymer layer (C) preferably exhibits a peeing force of 2 to 50 gf when the polymer layer (B) is interfacially peeled from the polymer layer (C) after heat curing, the peeling force being measured by 180° peeling using a test piece having a width of 25 mm.

The thermosetting siloxane-modified polymer layer (B) exhibiting such a peeling force prevents the wafer from slipping at the time of grinding the wafer, and the wafer can be easily separated. Thus, this range is preferable.

Furthermore, the present invention provides a method for manufacturing a thin wafer comprising the steps of:
(a) bonding a support and a circuit-forming front surface of a wafer that has the circuit-forming front surface and a non-circuit-forming back surface through a complex temporary adhesive material layer used for the above wafer processing laminate, the complex temporary adhesive material layer including the thermoplastic organopolysiloxane polymer layer (A), the thermosetting siloxane-modified polymer layer (B), and the thermosetting siloxane polymer layer (C), wherein the bonding is performed by forming the thermosetting siloxane polymer layer (C) on the support, forming the thermosetting siloxane-modified polymer layer (B) on the polymer layer (C), and then bonding the support, on which the polymer layers (B) and (C) have been formed, to the wafer on which a circuit and the polymer layer (A) have been formed, under vacuum;
(b) heat curing the polymer layers (B) and (C);
(c) grinding or polishing the non-circuit-forming back surface of the wafer bonded to the support;
(d) processing the non-circuit-forming back surface of the wafer;
(e) separating the support and the thermosetting siloxane polymer layer (C) laminated on the support together from the processed wafer; and
(f) separating the thermosetting siloxane-modified polymer layer (B) from the wafer after the step (e).

Such a method for manufacturing a thin wafer uses the temporary adhesive material layer including three layers of the present invention to bond the wafer and the support. Use of this temporary adhesive material layer allows easy production of a thin wafer having a through electrode structure or a bump connection structure. Moreover, the separating steps allow the support to be easily separated from the processed wafer even if the processed wafer has been diced before separation. Furthermore, bonding the support, on which the polymer layers (B) and (C) have been formed, to the circuit-formed wafer, on which the polymer layer (A) has been formed, under vacuum allows the polymer layer (B) to be formed by, for example, a spin coating method, thus enabling bonding regardless of the surface condition of the circuit-formed wafer.

Furthermore, the present invention provides a method for manufacturing a thin wafer comprising the steps of:
(a) bonding a support and a circuit-forming front surface of a wafer that has the circuit-forming front surface and a non-circuit-forming back surface through a complex temporary adhesive material layer used for the above wafer processing laminate, the complex temporary adhesive material layer including the thermoplastic organopolysiloxane polymer layer (A), the thermosetting siloxane-modified polymer layer (B), and the thermosetting siloxane polymer layer (C), wherein the bonding is performed by forming the thermoplastic organopolysiloxane polymer layer (A) on the wafer on which a circuit has been formed, forming the thermosetting siloxane-modified polymer layer (B) on the polymer layer (A), and then bonding the circuit-formed wafer, on which the polymer layers (A) and (B) have been formed, to the support on which the polymer layer (C) has been formed, under vacuum;
(b) heat curing the polymer layers (B) and (C);
(c) grinding or polishing the non-circuit-forming back surface of the wafer bonded to the support;
(d) processing the non-circuit-forming back surface of the wafer;
(e) separating the support and the thermosetting siloxane polymer layer (C) laminated on the support together from the processed wafer; and
(f) separating the thermosetting siloxane-modified polymer layer (B) from the wafer after the step (e).

Such a method for manufacturing a thin wafer uses the temporary adhesive material layer including three layers of the present invention to bond the wafer and the support. Use of this temporary adhesive material layer allows easy production of a thin wafer having a through electrode structure or a bump connection structure. Moreover, the separating steps allow the support to be easily separated from the processed wafer even if the processed wafer has been diced before separation. Furthermore, bonding the circuit-formed wafer, on which the polymer layers (A) and (B) have been formed, to the support, on which the polymer layer (C) has been formed, under vacuum allows the polymer layer (B) to be formed by, for example, the spin coating method without causing a residue of the polymer layer (B) on the side surface of the support, thus preventing the residue from peeling off in a subsequent step.

In the step (a), the thermoplastic organopolysiloxane polymer layer (A) is preferably formed on the circuit-formed wafer except for a peripheral portion.

Such a method for manufacturing a thin wafer causes the thermosetting siloxane-modified polymer layer (B) to be directly laminated on the peripheral portion of the circuit-formed wafer. This reduces the risk that separation occurs at the time of processing the circuit-formed wafer.

Advantageous Effects of Invention

The temporary adhesive material layer in the present invention has the three-layered structure, and particularly uses the thermosetting siloxane-modified resin (polymer layer (B)) as a supporting layer for bonding the substrate. This resin does not thermally decompose, does not flow at high temperature, and has excellent heat resistance. The temporary adhesive material layer is thus applicable to a wide range of the semiconductor film-forming process, and can form an adhesive material layer with high film-thickness uniformity even on a stepped wafer. This film-thickness uniformity enables a uniform thin wafer 50 μm or less thick to be easily manufactured. Furthermore, even if the manufactured thin wafer is cut by dicing before separation, the support can be easily separated at room temperature. Thus, a thin wafer, which is easy to break, can be readily manufactured.

BRIEF DESCRIPTION OF DRAWING

FIG. 1 is a cross-sectional view of an exemplary wafer processing laminate of the present invention.

DESCRIPTION OF EMBODIMENTS

Hereinafter, the present invention will be described in detail.

As described above, it has been desired to develop a wafer processing laminate and a temporary adhesive material for a wafer processing which facilitate temporary adhesion, allow formation of the layer with uniform film thickness on a heavily stepped substrate, are highly compatible with the steps of forming a TSV and forming a wiring on the back surface of the wafer, have excellent resistance to a wafer thermal process such as CVD, allow easy separation even when a thin wafer is cut before separation, and can increase productivity of thin wafers.

The present inventors earnestly studied to accomplish the above object and consequently found a method that can easily manufacture a thin wafer having a through electrode structure or a bump interconnect structure by using a temporary adhesive material layer that has a three-layer system including:
(A) a thermoplastic temporary adhesive layer composed of a thermoplastic organopolysiloxane polymer layer;
(B) a thermosetting temporary adhesive layer composed of a thermosetting siloxane-modified polymer layer; and
(C) a thermosetting temporary adhesive layer composed of a thermosetting siloxane polymer layer, in which the layers are formed in the order of (A), (B), and (C) from the wafer side to bond the wafer and the support.

FIG. 1 is a cross-sectional view of an exemplary wafer processing laminate of the present invention. As shown in FIG. 1, the wafer processing laminate of the present invention has a wafer 1 having a front surface on which a circuit is formed and a back surface to be processed, a support 3 for supporting the wafer 1 during processing the wafer 1, and a temporary adhesive material layer 2 placed between the wafer 1 and the support 3. The temporary adhesive material layer 2 has a three-layered structure including a thermoplastic organopolysiloxane polymer layer (A) (first temporary adhesive layer), a thermosetting siloxane-modified polymer layer (B) (second temporary adhesive layer), and a thermosetting siloxane polymer layer (C) (third temporary adhesive layer). The first temporary adhesive layer releasably adheres to the front surface of the wafer 1, and the third temporary adhesive layer adheres to the support 3.

The temporary adhesive material for a wafer processing of the present invention is composed of a laminated material of the polymer layers (A), (B), and (C), in which the layers are releasably laminated.

Hereinafter, the present invention will be described in more detail, but the present invention is not limited thereto.
[Temporary Adhesive Material Layer]
—First Temporary Adhesive Layer (A)/Thermoplastic Organopolysiloxane Polymer Layer—

The first temporary adhesive layer is composed of a thermoplastic organopolysiloxane polymer. The thermoplastic organopolysiloxane polymer may be, for example, an unreactive organopolysiloxane containing 99.000 to 99.999 mol %, preferably 99.500 to 99.999 mol % of a siloxane unit (D unit) shown by $R^{11}R^{12}SiO_{2/2}$, 1.000 to 0.001 mol %, preferably 0.500 to 0.001 mol % of a siloxane unit (M unit) shown by $R^{13}R^{14}R^{15}SiO_{1/2}$, and 0.000 to 0.500 mol %, preferably 0.000 to 0.100 mol % of a siloxane unit (T unit) shown by $R^{16}SiO_{3/2}$, having a weight average molecular weight of 200,000 to 1,000,000, and containing 0.5 mass % or less of a low molecular weight component having a molecular weight of 740 or less.

In the above formulae, the organic substituents $R^{11}$, $R^{12}$, $R^{13}$, $R^{14}$, $R^{15}$, and $R^{16}$ each represent an unsubstituted or substituted monovalent hydrocarbon group, preferably an unsubstituted or substituted monovalent hydrocarbon group having 1 to 10 carbon atoms. Illustrative examples thereof include hydrocarbon groups, e.g., alkyl groups such as a methyl group, an ethyl group, an n-propyl group, an isopropyl group, an n-butyl group, a tert-butyl group, an n-pentyl group, a cyclopentyl group, and an n-hexyl group, cycloalkyl groups such as a cyclohexyl group, aryl groups such as a phenyl group and a tolyl group; and groups in which a part or all of the hydrogen atoms of the above groups is/are substituted by a halogen atom(s). Among them, a methyl group and a phenyl group are preferable.

The molecular weight of the organopolysiloxane is expressed by a weight average molecular weight obtained in accordance with a calibration curve prepared with a polystyrene standard substance by gel permeation chromatography (GPO) (Herein, "weight average molecular weight" means this value.). The weight average molecular weight is 200,000 or more, preferably 350,000 or more and 1,000,000 or less, more preferably 800,000 or less. The content of the low molecular weight component having a molecular weight of 740 or less is 0.5 mass % or less, more preferably 0.1 mass % or less.

The organopolysiloxane having a weight average molecular weight of 200,000 or more can sufficiently withstand the grinding step for thinning the wafer, thus being preferable. Additionally, the organopolysiloxane having a weight average molecular weight of 1,000,000 or less can be cleaned in a cleaning step after completion of the process, thus being preferable. On the other hand, when the content of the low molecular weight component having a molecular weight of 740 or less is 0.5 mass % or less, sufficient heat resistance can be obtained to withstand a heat treatment for forming a through electrode or a heat treatment for forming bump electrodes on the wafer back surface, thus it is preferable.

Furthermore, D unit preferably constitutes 99.000 to 99.999 mol % of the resin. When this content is 99.000 mol % or more, the resin can withstand the grinding step for thinning the wafer, thus it is preferable. When the content is 99.999 mol % or less, the resin can be easily separated from the temporary adhesive layer (B) after completion of the step.

M unit is added to cap the active group at the ends of the resin mainly consisting of 0 unit, and used for adjusting the molecular weight thereof.

The thermoplastic organopolysiloxane polymer layer may be previously formed into a film and then bonded to the wafer with a roll laminator. Alternatively, the layer may be formed on the wafer by applying its solution by a method such as spin coating and roll coater. When the layer (A) is formed on the wafer by spin coating or the like, it is preferred to apply a solution of the resin. In this case, a hydrocarbon solvent, such as pentane, hexane, cyclohexane, decane, isododecane, and limonene, is preferably used. The layer (A) is preferably formed with a thickness of 0.1 to 10 μm, more preferably 0.5 to 5.0 μm and used. When the thickness is 0.1 μm or more, this layer can fully coat the subject without an uncoated region and can cover steps on the device wafer. When the thickness is 10 μm or less, it can sufficiently withstand the grinding step for forming a thin wafer. Thus, this range is preferable.

In addition, the thermoplastic organopolysiloxane polymer layer (A) used as the first temporary adhesive layer of the wafer processing laminate is preferably formed on a partial surface of the wafer (a peripheral portion of the layer is preferably partially removed) and releasably adheres to the partial surface.

The wafer processing laminate including such a polymer layer (A) allows the thermosetting siloxane-modified polymer layer (B) to be partially directly laminated on the circuit-formed wafer, and thus reduces the risk that separation occurs at the time of processing the circuit-formed wafer.

—Second Temporary Adhesive Layer (B)/Thermosetting Siloxane-Modified Polymer Layer—

The thermosetting siloxane-modified polymer layer (B), which is a constitutional element of the wafer processing laminate and the temporary adhesive material for a wafer processing of the present invention, is not particularly limited so long as it is a thermosetting siloxane-modified polymer layer. The polymer layer (B) is preferably a cured layer of the thermosetting composition mainly consisting of the thermosetting siloxane-modified polymer shown by the following general formula (1) or (3). Polymer of formula (1) (phenolic siloxane polymer):

A polymer of the general formula (1) is a siloxane bond-containing polymer (phenol group-containing organosiloxane bond-containing polymer compound). This polymer has a repeating unit shown by the general formula (1) and a weight average molecular weight of 3,000 to 500,000, preferably 10,000 to 100,000,

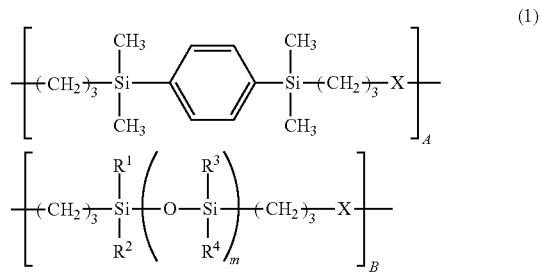

wherein $R^1$ to $R^4$ may be the same or different, and represent a monovalent hydrocarbon group having 1 to 8 carbon atoms; "m" is an integer of 1 to 100; B is a positive number; A is 0 or a positive number; and X is a divalent organic group shown by the following general formula (2),

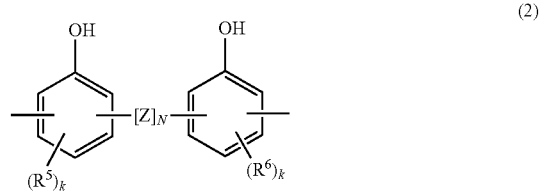

wherein Z represents a divalent organic group selected from any of

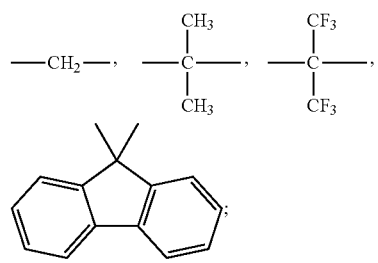

N represents 0 or 1; $R^5$ and $R^6$ each represent an alkyl or alkoxy group having 1 to 4 carbon atoms, and may be the same or different from each other; and "k" represents any of 0, 1, and 2.

In this case, illustrative examples of $R^1$ to $R^4$ include alkyl groups such as a methyl group and an ethyl group; and a phenyl group. "m" represents an integer of preferably 3 to 60, more preferably 8 to 40. B/A ranges from 0 to 20, particularly from 0.5 to 5.

Polymer of Formula (3) (Epoxy-Modified Siloxane Polymer):

A polymer of the general formula (3) is a siloxane bond-containing polymer (epoxy group-containing silicone polymer compound). This polymer has a repeating unit shown by the general formula (3) and a weight average molecular weight of 3,000 to 500,000,

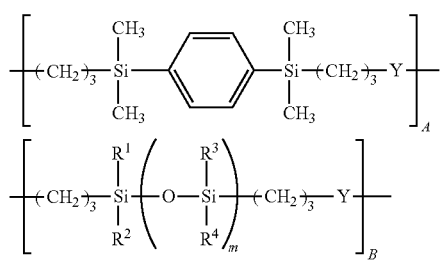

wherein $R^1$ to $R^4$ may be the same or different, and represent a monovalent hydrocarbon group having 1 to 8 carbon atoms; "m" is an integer of 1 to 100; B is a positive number; A is 0 or a positive number; and Y is a divalent organic group shown by the following general formula (4),

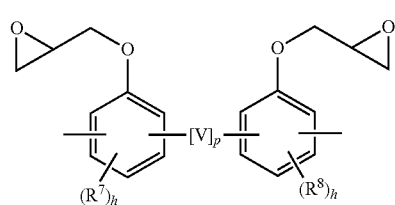

wherein V represents a divalent organic group selected from any of

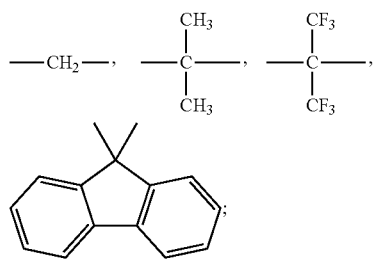

"p" represents 0 or 1; $R^7$ and $R^8$ each represent an alkyl or alkoxy group having 1 to 4 carbon atoms, and may be the same or different from each other; and "h" represents any of 0, 1, and 2.

In this case, illustrative examples of $R^1$ to $R^4$ and "m" are the same as in the general formula (1).

The thermosetting composition mainly consisting of the thermosetting siloxane-modified polymer of the general formula (1) or (3) contains one or more crosslinkers for heat curing. In the case of the phenolic siloxane polymer of the general formula (1), the crosslinker is selected from an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule.

Here, the amino condensate, the melamine resin, the urea resin each modified with formalin or formalin-alcohol may be exemplified by the following. For example, the melamine resin (condensate) modified with formalin or formalin-alcohol can be obtained by addition condensation polymerization of a modified melamine monomer (e.g. trimethoxymethyl monomethylol melamine), or a polymer thereof (e.g. oligomer such as dimer and trimer) with formaldehyde until a desired molecular weight is achieved, according to a known method. These compounds may be used alone or in combination of two or more kinds.

The urea resin (condensate) modified with formalin or formalin-alcohol can be prepared by modifying a urea condensate having a desired molecular weight with formalin into a methylol form, and optionally, further modifying the resultant compound with an alcohol into an alkoxy form, according to a known method. Illustrative examples of the urea resin modified with formalin or formalin-alcohol include methoxymethylated urea condensate, ethoxymethylated urea condensate, and propoxymethylated urea condensate. These compounds may be used alone or in combination of two or more kinds.

Illustrative examples of the phenol compound having on average two or more methylol or alkoxymethylol groups per molecule include (2-hydroxy-5-methyl)-1,3-benzenedimethanol and 2,2',6,6'-tetramethoxymethyl-bisphenol A. These phenol compounds may be used alone or in combination of two or more kinds.

On the other hand, in the case of the epoxy-modified siloxane polymer of the general formula (3), the composition contains one or more crosslinkers selected from an epoxy compound having on average two or more epoxy groups per molecule and a phenol compound having on average two or more phenol groups per molecule.

Here, the epoxy compound having a polyfunctional epoxy group used in the polymers of the general formulae (1) and (3) is not particularly limited. In particular, a bi-functional, a tri-functional, or a tetra-functional or more of the polyfunctional epoxy resins, for example, EOCN-1020, EOCN-102S, XD-1000, NC-2000-L, EPPN-201, GAN, and NC6000 all available from Nippon Kayaku Co., Ltd., or a crosslinker shown by the following formula may be contained.

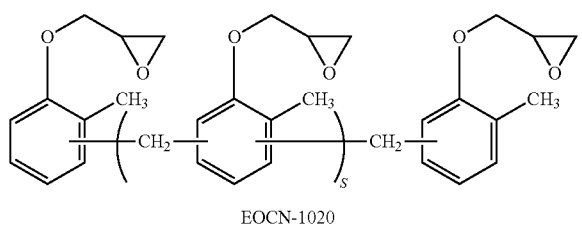

EOCN-1020

S = 3~6

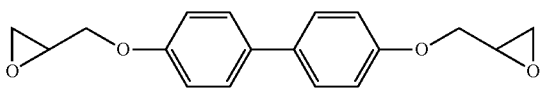

-continued

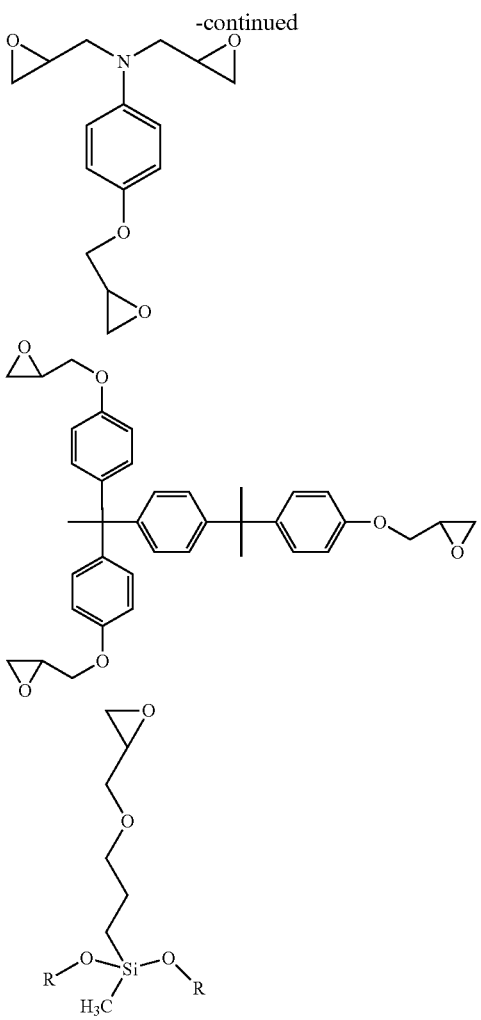

R = methyl group or ethyl group

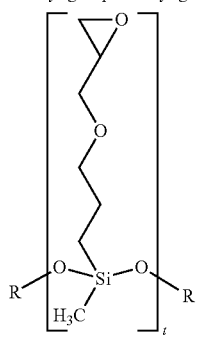

R = methyl group or ethyl group t = 1  20%
t = 2  75%
t ≧ 3  5%

In the case that the thermosetting siloxane-modified polymer is the epoxy-modified siloxane polymer of the general formula (3), examples of its crosslinker include m- or p-cresol-novolac resins such as EP-6030G available from Asahi Organic Chemicals Industry Co., Ltd., tri-functional phenol compounds such as Tris-P-PA available from Honshu Chemical Industry Co., Ltd., and tetra-functional phenol compounds such as TEP-TPA available from Asahi Organic Chemicals Industry Co., Ltd., etc.

The formulation amount of the crosslinker is 0.1 to 50 parts by mass, preferably 0.1 to 30 parts by mass, more preferably 1 to 20 parts by mass based on 100 parts by mass of the thermosetting siloxane-modified polymer. Two, three or more crosslinkers may be blended in combination.

A curing catalyst such as an acid anhydride may be added in an amount of 10 parts by mass or less based on 100 parts by mass of the thermosetting siloxane-modified polymer.

The composition (the thermosetting siloxane-modified polymer) may be dissolved in a solvent and applied by a method such as spin coating, roll coater, and die coater, particularly by spin coating, to form a layer on the layer (A) or (C). In this case, illustrative examples of the solvent include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxy propionate, tert-butyl acetate, tert-butyl propionate, propylene glycol mono-tert-butyl ether acetate, and γ-butyrolactone. These solvents may be used alone or in combination of two or more kinds.

In addition, a known antioxidant and a filler such as silica may be added in an amount of 50 parts by mass or less based on 100 parts by mass of the thermosetting siloxane-modified polymer to improve heat resistance. Moreover, a surfactant may be added to improve coating uniformity.

Illustrative examples of the antioxidant that can be added into the polymer layer (B) include hindered phenol compounds such as tetrakis[methylene-(3,5-di-tert-butyl-4-hydroxyhydrocinnamate)]methane (product name: Adekastab AO-60).

The thermosetting siloxane-modified polymer layer (B) composed of the above-mentioned thermosetting siloxane-modified polymer is preferably formed with a film thickness of 15 to 150 μm, more preferably 20 to 120 μm, according to unevenness at the wafer side. When the film thickness is 15 μm or more, it can sufficiently withstand the grinding step for thinning the wafer. When the film thickness is 150 μm or less, the resin is prevented from deforming in the heat treatment process such as TSV formation process, and can be put to practical use. Thus, this range is preferable.

—Third Temporary Adhesive Layer (C)/Thermosetting Siloxane Polymer Layer (Thermosetting Silicone Polymer Layer)—

The thermosetting siloxane polymer layer (C), which is a constitutional element of the wafer processing laminate and the temporary adhesive material for a wafer processing of the present invention, is not particularly limited so long as it is composed of a thermosetting siloxane polymer. For example, the polymer layer (C) is preferably a cured layer of a composition containing the following components (C-1) to (C-3) and optional component (C-4).

(C-1) an organopolysiloxane having two or more alkenyl groups per molecule;
(C-2) an organohydrogenpolysiloxane having two or more silicon-bonded hydrogen atoms (Si—H groups) per molecule, in such an amount that a mole ratio of the Si—H group in the component (C-2) to the alkenyl group in the component (C-1) ranges from 0.3 to 10;
(C-3) a platinum-based catalyst.

The thermosetting siloxane polymer layer (C) preferably further contains (C-4) a reaction retarder in an amount of 0.1 to 10 parts by mass based on 100 parts by mass of a total of the component (C-1) and the component (C-2).

Hereinafter, each component will be described. [Component (C-1)]

The component (C-1) is an organopolysiloxane having two or more alkenyl groups per molecule. The component (C-1) is preferably a linear or branched diorganopolysiloxane containing two or more alkenyl groups per molecule, particularly preferably a diorganopolysiloxane containing 0.6 to 9 mol % (mole of alkenyl group/mole of Si) of alkenyl groups per molecule.

Illustrative examples of such diorganopolysiloxane include compounds shown by the following general formula (5) and/or (6),

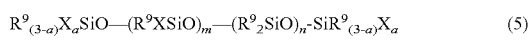

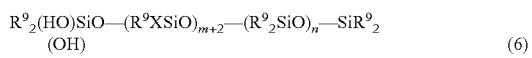

wherein $R^9$ independently represents a monovalent hydrocarbon group having no aliphatic unsaturated bond; X independently represents a monovalent organic group containing an alkenyl group; and "a" is an integer of 0 to 3. In the formula (5), 2a+m is such a number that the content of alkenyl group is 0.6 to 9 mol % per molecule. In the formula (6), m+2 is such a number that the content of alkenyl group is 0.6 to 9 mol % per molecule.

In the above formulae, $R^9$ is preferably a monovalent hydrocarbon group having 1 to 10 carbon atoms. Examples thereof include alkyl groups such as a methyl group, an ethyl group, a propyl group, and a butyl group; cycloalkyl groups such as a cyclohexyl group; and aryl groups such as a phenyl group and a tolyl group. In particular, alkyl groups such as a methyl group and a phenyl group are preferable.

X, a monovalent organic group having an alkenyl group, is preferably an organic group having 2 to 10 carbon atoms. Examples thereof include alkenyl groups such as a vinyl group, an allyl group, a hexenyl group, and an octenyl group; (meth)acryloylalkyl groups such as an acryloylpropyl group, acryloylmethyl group, and methacryloylpropyl group; (meth)acryloxyalkyl groups such as an acryloxypropyl group, an acryloxymethyl group, a methacryloxypropyl group, and a methacryloxymethyl group; and alkenyl group-containing monovalent hydrocarbon groups such as a cyclohexenylethyl group and a vinyloxypropyl group. In particular, a vinyl group is industrially preferable.

In the general formula (5), "a" is an integer of 0 to 3, preferably 1 to 3. This preferable range allows terminals of the molecular chain to be blocked with alkenyl groups, and thus the reaction can be completed within a short time by the alkenyl groups with good reactivity at the terminal of the molecular chain. Furthermore, a-1 is industrially preferred in view of the cost. This alkenyl group-containing diorganopolysiloxane is preferably in an oil state or a crude rubber state. The alkenyl group-containing diorganopolysiloxane may be linear or branched.

[Component (C-2)]

The component (C-2) is a crosslinker, an organohydrogenpolysiloxane having two or more silicon-bonded hydrogen atoms (Si—H groups) per molecule. The component (C-2) has at least two, preferably 3 or more silicon-bonded hydrogen atoms (SiH groups) per molecule, and may have a linear, branched, or cyclic structure.

The viscosity at 25° C. of the organohydrogenpolysiloxane, component (C-2), is preferably 1 to 5,000 mPa·s, more preferably 5 to 500 mPa·s. The organohydrogenpolysiloxane may be a mixture of two or more kinds.

The component (C-2) is preferably blended such that a mole ratio of the Si—H group in the component (C-2) to the alkenyl group in the component (C-1) (SiH group/alkenyl group) ranges from 0.3 to 10, particularly 1.0 to 8.0. When the mole ratio between the SiH group and the alkenyl group is 0.3 or more, crosslinking density is not decreased, and the problem of inability to cure the adhesive layer is not caused. When the mole ratio is 10 or less, the crosslinking density is not excessively increased, and sufficient viscosity and tackiness can be achieved. In addition, the mole ratio of 10 or less makes the available time of the solution to be treated longer.

[Component (C-3)]

The component (C-3) is a platinum-based catalyst (i.e. platinum group metal catalyst). Examples thereof include chloroplatinic acid, an alcohol solution of chloroplatinic acid, a reaction product of chloroplatinic acid with alcohol, a reaction product of chloroplatinic acid with an olefin compound, and a reaction product of chloroplatinic acid with a vinyl group-containing siloxane.

The adding amount of the component (C-3) is an effective amount, generally 1 to 5,000 ppm, preferably 5 to 2,000 ppm, in terms of (the mass of) platinum with respect to the total of (C-1) and (C-2) (if a later-described component (C-4) is contained, the total of (C-1), (C-2), and (C-4)). When the amount is 1 ppm or more, curability of the composition is not decreased, and crosslinking density and holding force are also not decreased. When the amount is 5,000 ppm or less, the available time of the solution to be treated can be prolonged.

[Component (C-4)]

The component (C-4) is a reaction retarder, and is optionally added when the composition is prepared or applied to the base to prevent the solution to be treated from thickening and gelling before heat curing.

Illustrative examples thereof include 3-methyl-1-butyn-3-ol, 3-methyl-1-pentyne-3-ol, 3,5-dimethyl-1-hexyne-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynoxy)dimethylsilane, 1,3,5,7-tetramethyl-1,3,5,7-tetravinylcyclotetrasiloxane, and 1,1,3,3-tetramethyl-1,3-divinyldisiloxane. Among them, 1-ethynylcyclohexanol and 3-methyl-1-butyn-3-ol are preferable.

If the component (C-4) is contained in the composition, the formulation amount thereof is preferably 0.1 to 10 parts by mass, more preferably 0.1 to 8.0 parts by mass, much more preferably 0.1 to 2.0 parts by mass, based on 100 parts by mass of the total of the components (C-1) and (C-2). When the amount is 10 parts by mass or less, curability of the composition is not decreased. When the amount is 0.1 part by mass or more, the effect of reaction retarder can be sufficiently exhibited.

The thermosetting siloxane polymer layer (C) may be formed on the support by applying its solution by a method such as spin coating and roll coater. When the thermosetting siloxane polymer layer (C) is formed on the support by spin coating or the like, it is preferred to apply a solution of the resin. In this case, a hydrocarbon solvent such as pentane, hexane, cyclohexane, isooctane, nonane, decane, p-menthane, pinene, isododecane, and limonene is preferably used. In addition, a known antioxidant may be added to the solution of the thermosetting siloxane polymer to improve heat resistance.

The thermosetting siloxane polymer layer (C) is preferably formed with a film thickness of 0.1 to 30 µm, particularly 1.0 to 15 µl. When the film thickness is 0.1 µm or more, the layer can fully coat the subject without an uncoated region. When the film thickness is 30 µm or less, it can withstand the grinding step for thinning the wafer. Thus, this range is preferable. In addition, the thermosetting siloxane polymer layer (C) may further contain a filler such as silica in an amount of 50 parts by mass or less based on 100 parts by mass of the polymer layer (C) to improve heat resistance.

Moreover, the thermosetting siloxane-modified polymer layer (B) laminated on the polymer layer (C) exhibits a peeing force of typically 2 to 50 gf, preferably 3 to 30 gf, more preferably 5 to 20 gf, as measured by 180° peeling using a test piece having a width of 25 mm, when the polymer layer (B) is interfacially peeled from the polymer layer (C) after heat curing. When the peeling force is 2 gf or more, the wafer is prevented from slipping at the time of grinding the wafer. When the peeling force is 50 gf or less, the wafer can be easily separated. Thus, this range is preferable.

Optional Component

Optional components, besides the above-mentioned components, may be added to the temporary adhesive material for a wafer processing of the present invention. Usable example thereof include unreactive organopolysiloxanes such as polydimethyl siloxane and polydimethyldiphenyl siloxane; antioxidants of phenol type, quinone type, amine type, phosphorus type, phosphite type, sulfur type, thioether type, or other type; photo stabilizers of triazole type, benzophenone type, or other type; flame retardants of phosphoric acid ester type, halogen type, phosphorus type, antimony type, or other type; antistatic agents such as a cationic activator, an anionic activator, and a nonionic activator; and solvents for reducing the viscosity during coating, which include aromatic solvents such as toluene and xylene, aliphatic solvents such as hexane, octane, and isoparaffin, ketone solvents such as methyl ethyl ketone and methyl isobutyl ketone, ester solvents such as ethyl acetate and isobutyl acetate, ether solvents such as diisopropyl ether and 1,4-dioxane, and a mixed solvent thereof.

[Method for Manufacturing Thin Wafer]

The method for manufacturing a thin wafer of the present invention is characterized by using the complex temporary adhesive material layer composed of three layers including the thermoplastic organopolysiloxane polymer layer (A), the thermosetting siloxane-modified polymer layer (B), and the thermosetting siloxane polymer layer (C) as the layer for bonding the support to the wafer having a semiconductor circuit or the like. The thickness of a thin wafer obtained by the manufacturing method of the present invention is typically 5 to 300 µm, more typically 10 to 100 µm.

The method for manufacturing a thin wafer of the present invention has the steps (a) to (e), and optionally has the steps (f) to (j), if necessary.

[Step (a)]

Step (a) is a step of bonding a support and a circuit-forming front surface of a wafer that has the circuit-forming front surface and a non-circuit-forming back surface through the complex temporary adhesive material layer, which includes the thermoplastic organopolysiloxane polymer layer (A), the thermosetting siloxane-modified polymer layer (B), and the thermosetting siloxane polymer layer (C), used for the inventive temporary adhesive material for a wafer processing. In this step, the bonding may be performed, under vacuum, by forming the thermosetting siloxane polymer layer (C) on the support, forming the thermosetting siloxane-modified polymer layer (B) on the polymer layer (C), and then bonding the support, on which the polymer layers (B) and (C) have been formed, to the circuit-formed wafer on which the polymer layer (A) has been formed. Alternatively, the bonding may be performed, under vacuum, by forming the thermoplastic organopolysiloxane polymer layer (A) on the circuit-formed wafer, forming the thermosetting siloxane-modified polymer layer (B) on the polymer layer (A), and then bonding the circuit-formed wafer, on which the polymer layers (A) and (B) have been formed, to the support on which the polymer layer (C) has been formed.

The wafer that has a circuit-forming front surface and a non-circuit-forming back surface is a wafer one of the surfaces of which is a circuit-forming surface, and the other surface of which is a non-circuit-forming surface. The wafer to which the present invention can be applied is typically a semiconductor wafer. Examples of the semiconductor wafer include not only a silicon wafer, but also a germanium wafer, a gallium-arsenic wafer, a gallium-phosphorus wafer, and a gallium-arsenic-aluminum wafer. The thickness of the wafer is typically, but not particularly limited to, 600 to 800 µm, more typically 625 to 775 µm.

As the support, a substrate such as a silicon wafer, a glass plate, and a quartz wafer can be used without any limitation. In the present invention, it is not necessary to irradiate an energy beam to the temporary adhesive material layer through the support, so that the support does not require light transmittance.

The temporary adhesive layers (A), (B), and (C) may be each formed as a film on the wafer or the support. Alternatively, these layers may be formed by applying the respective solutions to the wafer or the support by spin coating or other method. In this case, after spin coating, the layers are prebaked at 80 to 200° C. depending on the volatile conditions of the used solvent, and then used.

The wafer and the support on which the temporary adhesive layers (A), (B), and (C) have been formed are formed into a substrate that is bonded via the layers (A), (B), and (C). At this time, this substrate is compressed by uniform compression under reduced pressure at a temperature in the range of preferably 40 to 200° C., more preferably 60 to 180° C. to form a wafer processing laminate (laminated substrate) in which the wafer are bonded to the support.

Examples of a wafer-bonding apparatus include a commercially available wafer-bonding apparatus such as EVG520IS and 850 TB manufactured by EV Group, and XBC300 manufactured by SUSS MicroTec AG.

In the step (a), the thermoplastic organopolysiloxane polymer layer (A) may be formed on the circuit-formed wafer except for a peripheral portion, as needed. For example, the polymer layer (A) is preferably formed on the circuit-formed wafer except for a portion 0.1 mm to 10 mm, more preferably 0.5 mm to 5 mm, much more preferably 1 mm to 4 mm from the periphery of the wafer. At the portion in which the polymer layer (A) is not formed, the thermosetting siloxane-modified polymer layer (B) is directly laminated on the circuit-formed wafer. This reduces the risk that separation occurs at the time of processing the circuit-formed wafer. When the width of this portion is 0.1 mm or more, the separation-preventing effect is sufficiently exhibited to fixedly bond the circuit-formed wafer and the polymer layer (B). When the width is 10 mm or less, the number of chips obtained from the processed circuit-formed wafer increases. Thus, this range is preferable.

The portion, in which the polymer layer (A) is not formed, can be provided by the following method: for example, applying a solution of the thermoplastic organopolysiloxane polymer on the wafer surface by spin coating to form the polymer layer (A) and then performing an edge-cut treatment; or performing an edge-cut treatment at the time of spin coating. The edge-cut treatment can be performed by, for example, dissolving and removing the bonded portion with a solvent (such as isododecane); or mechanically removing it by force.

[Step (b)]

Step (b) is a step of heat curing the polymer layers (B) and (C). After the wafer processing laminate (laminated substrate) is formed, the wafer processing laminate is heated at 120 to 220° C., preferably 150 to 200° C., for 10 minutes to 4 hours, preferably 30 minutes to 2 hours, to cure the polymer layers (B) and (C).

[Step (c)]

Step (c) is a step of grinding or polishing the non-circuit-forming back surface of the wafer bonded to the support, i.e., a step of grinding the wafer processing laminate obtained by bonding in the step (a) from the wafer back surface side to reduce the thickness of the wafer. The technique for grinding the wafer back surface is not particularly limited, and known grinding techniques may be used. The grinding is preferably performed while water is fed to the wafer and a grinding wheel (e.g. diamond) for cooling. Examples of an apparatus for grinding the wafer back surface include DAG-810 (product name) manufactured by DISCO Co., Ltd. The wafer back surface side may be subjected to CMP polishing.

[Step (d)]

Step (d) is a step of processing the non-circuit-forming back surface of the wafer processing laminate that has been ground, i.e., the non-circuit-forming surface of the wafer processing laminate that has been thinned by grinding the back surface. This step includes various processes applied in the wafer level. Examples thereof include electrode formation, metal wiring formation, and protective film formation. More specifically, there may be mentioned well-known processes including metal sputtering for forming electrodes or the like, wet etching for etching a sputtered metal layer, patterning process in which a resist is applied and subjected to exposure and development to form a pattern used as a mask for metal wiring formation, resist removal, dry etching, plating with metal, silicon etching for forming a TSV, and formation of an oxide film on silicon surface. In addition, the wafer that has been thinned by grinding the back surface may be cut into chips by dicing or the like.

[Step (e)]

Step (e) is a step of separating the support and the thermosetting siloxane polymer layer (C) laminated on the support together from the wafer processed in the step (d), i.e., a step of separating the support and the polymer layer (C) from the wafer processing laminate after the thinned wafer is subjected to various processes. This separating step is generally carried out under relatively low temperature conditions from room temperature to about 60° C. This step may performed by a method in which either the wafer or the support of the wafer processing laminate is horizontally fixed, and the other is lifted at a certain angle with respect to the horizontal direction; or a method in which a protective film is bonded to the ground surface of the wafer, and then the wafer and the protective film are separated from the wafer processing laminate by peeling.

Both the separating methods can be applied to the present invention, although it is not limited to these methods. These separating methods are usually carried out at room temperature.

The step (e) of separating the support and the polymer layer (C) from the processed wafer preferably includes the steps of:

(g) bonding a dicing tape to the processed surface of the processed wafer;

(h) attaching a dicing tape surface by vacuum suction to a suction surface; and (i) separating the support from the processed wafer by peeling-off at a temperature of the suction surface in the range of 10° C. to 100° C. These steps enable the support to be easily separated from the processed wafer, and facilitate a subsequent dicing step.

[Step (f)]

Step (f) is a step of separating the thermosetting siloxane-modified polymer layer (B) from the processed wafer by, for example, tape peeling, after the support and the thermosetting siloxane polymer layer (C) are removed in the step (e).

This separating step is usually carried out under relatively low temperature conditions from room temperature to about 60° C. The polymer layer (B) can be separated from the processed wafer, for example, by horizontally fixing the wafer processing laminate, bonding a tape for peeling to the uncovered thermosetting siloxane-modified polymer layer (B), and peeling the tape.

The tape may be any tape capable of peeling. In particular, a tape using silicone adhesive material is preferable. For example, polyester film adhesive tapes No. 646S and No. 648, made of Teraoka Seisakusho Co., Ltd., are preferably used.

In the case that the temporary adhesive layer (A) has been formed on the wafer except for the peripheral portion in the step (a), the temporary adhesive layer (B) may remain on this portion. However, the reminder is ignorable because the peripheral portion of the wafer cannot yield good chips from the beginning.

After the thermosetting siloxane-modified polymer layer (B) is separated from the processed wafer in the step (f), it is preferable to remove the temporary adhesive material layer remaining on the circuit-forming front surface of the separated wafer, as step (j). The temporary adhesive layer (A) may partially remain on the circuit-forming surface of the wafer that has been separated from the support by the step (f). In this case, the temporary adhesive layer (A) can be removed by, for example, cleaning the wafer.

In the step (j), any cleaning solution can be used so long as the solution can dissolve the thermoplastic organopolysiloxane polymer layer constituting the layer (A) in the temporary adhesive material layer. Illustrative examples thereof include pentane, hexane, cyclohexane, decane, isononane, p-menthane, pinene, isododecane, and limonene. These solvents may be used alone, or a combination of two or more kinds thereof. If removal is difficult, a base or an acid may be added to the solvent. Examples of the usable base include amines such as ethanolamine, diethanolamine, triethanolamine, triethylamine, and ammonia; and ammonium salts such as tetramethylammonium hydroxide. Examples of the usable acid include organic acids such as acetic acid, oxalic acid, benzenesulfonic acid, and dodecylbenzenesulfonic acid. The amount thereof is 0.01 to 10 mass %, preferably 0.1 to 5 mass % in terms of concentration in the cleaning solution. To improve removal efficiency of the residual matters, an existing surfactant may be added thereto. Cleaning may be performed by paddling with the above-mentioned solution, spraying, or dipping in a cleaner tank. The temperature in this operation is preferably 10 to 80° C., more preferably 15 to 65° C. If necessary, after dissolving the layer (A) in the dissolving solution, the wafer may be finally rinsed with water or an alcohol and then dried to obtain a thin wafer.

EXAMPLES

In the following, the present invention will be specifically described with reference to Examples and Comparative Examples, but the present invention is not limited to these Examples.

Resin Synthesis Example 1

A four-necked flask was charged with 1,000 g (3.38 mol) of octamethylcyclotetrasiloxane and 0.24 g (0.0015 mol) of hexamethyldisiloxane, and the mixture was maintained at 110° C. Then, 4 g of 10 mass % tetrabutylphosphonium hydroxide siliconate was added to the mixture. After polymerization over 4 hours, a post-treatment was carried out at 160° C. for 2 hours to obtain dimethylpolysiloxane.

The dimethylpolysiloxane was analyzed by $^{29}$Si-NMR method to determine the ratio of D unit and M unit, consequently identified as a dimethylpolysiloxane having the following structure containing 99.978% of D unit and 0.022% of M unit with a polymerization degree of about 9,000.

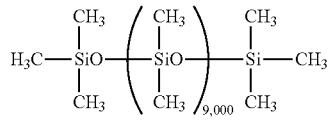

500 g of the dimethylpolysiloxane was dissolved in 500 g of hexane, the solution was then added to 2 L of acetone, and the precipitated resin was collected. Thereafter, hexane, etc., were removed under vacuum to obtain a dimethylpolysiloxane polymer having a weight average molecular weight of 700,000 and containing 0.05 mass % of a low molecular weight component having a molecular weight of 740 or less. 10 g of this polymer was dissolved in 90 g of isododecane, and the solution was filtered through a 0.2-μm membrane filter to obtain an isododecane solution (A-1) of the dimethylpolysiloxane polymer.

The weight average molecular weight was measured by GPC.

Resin Synthesis Example 2

A four-necked flask was charged with 1,000 g (3.38 mol) of octamethylcyclotetrasiloxane and 0.93 g (0.003 mol) of tris(trimethylsiloxy)methylsilane, and the mixture was maintained at 110° C. Then, 4 g of 10 mass % tetrabutyl phosphonium hydroxide siliconate was added to the mixture. After polymerization over 4 hours, a post-treatment was carried out at 160° C. for 2 hours to obtain dimethylpolysiloxane.

The obtained dimethylpolysiloxane was analyzed by $^{29}$Si-NMR method to determine the ratio of D unit, M unit, and T unit, consequently identified as a branched dimethylpolysiloxane having the following structure containing 99.911% of D unit, 0.067% of M unit, and 0.022% of T unit.

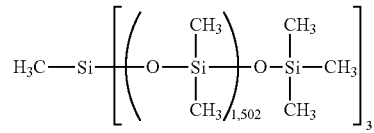

500 g of the branched dimethylpolysiloxane was dissolved in 500 g of hexane, the solution was then added to 2 L of acetone, and the precipitated resin was collected. Thereafter, hexane, etc., were removed under vacuum to obtain a dimethylpolysiloxane polymer having a weight average molecular weight of 400,000 and containing 0.07 mass % of a low molecular weight component having a molecular weight of 740 or less. 20 g of this polymer was dissolved in 80 g of isododecane, and the solution was filtered through a 0.2-μm membrane filter to obtain an isododecane solution (A-2) of the dimethylpolysiloxane polymer.

Resin Synthesis Example 3

In a flask equipped with a stirrer, a thermometer, a nitrogen purge system, and a reflux condenser were put 43.1 g of 9,9'-bis(3-allyl-4-hydroxyphenyl)fluorene (M-1), 29.5 g of organohydrogensiloxane having average structural formula (M-3), 135 g of toluene, and 0.04 g of chloroplatinic acid, and the mixture was heated at 80° C. Then, 17.5 g of 1,4-bis(dimethylsilyl)benzene (M-5) was added dropwise into the flask over 1 hour. At this time, the temperature inside the flask was increased to 85° C. After completion of dropwise addition, the mixture was aged at 80° C. for 2 hours, toluene was then distilled off, and 100 g of cyclohexanone was added thereto to obtain a resin solution containing cyclohexanone as a solvent with a concentration of the resin solid of 40 mass %. When the molecular weight of the resin in the solution was measured by GPC, the weight average molecular weight was 45,000 in terms of polystyrene. Then, 50 g of the resin solution was mixed with 7.5 g of an epoxy crosslinker, EOCN-1020 available from NIPPON KAYAKU Co., Ltd., as a crosslinker, 0.2 g of BSDM (bis(tert-butylsulfonyl)diazomethane) available from Wako Pure Chemical Industries Ltd., as a curing catalyst, and 0.1 g of tetrakis[methylene-(3,5-di-tert-butyl-4-hydroxyhydrocinnamate)]methane (product name: Adekastab AO-60) as an antioxidant. The solution was then filtered through a 0.2-11 m membrane filter to obtain a resin solution (B-1).

Resin Synthesis Example 4

In a 5-L flask equipped with a stirrer, a thermometer, a nitrogen purge system, and a reflux condenser, 84.1 g of epoxy compound (M-2) was dissolved in 600 g of toluene. Then, 294.6 g of compound (M-3) and 25.5 g of compound (M-4) were added to the solution, and the mixture was heated at 60° C. Thereafter, 1 g of carbon carried platinum catalyst (5 mass %) was added thereto, and after confirming that the internal reaction temperature was increased to 65 to 67° C., the mixture was further heated to 90° C. and aged for 3 hours. Then, the mixture was cooled to room temperature, and 600 g of methyl isobutyl ketone (MIBK) was added thereto. This reaction solution was filtered under pressure through a filter to remove the platinum catalyst. The solvent in the resin solution was distilled off under reduced pressure, and 270 g of propylene glycol monomethyl ether acetate (PGMEA) was added thereto to obtain a resin solution containing PGMEA as a solvent with a concentration of the solid component of 65 mass %. When the molecular weight of the resin in the resin solution was measured by GPC, the weight average molecular weight was 28,000 in terms of polystyrene. Then, 100 g of the resin solution was mixed with 9 g of a tetra-functional phenol compound, TEP-TPA (available from Asahi Organic Chemicals Industry Co., Ltd.), and 0.2 g of tetrahydrophthalic anhydride (available from New Japan Chemical Co., Ltd., RIKACID HH-A). The solution was then filtered through a 0.2-μm membrane filter to obtain a resin solution (B-2).

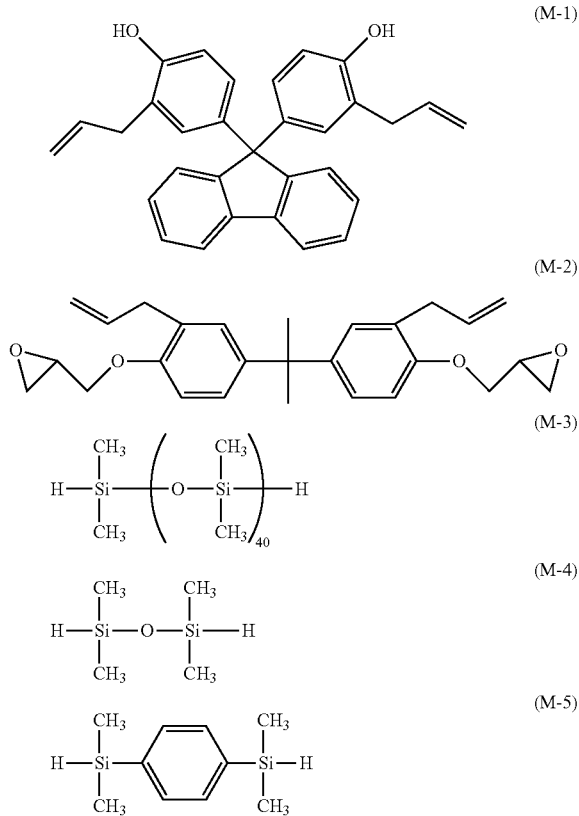

Resin Solution Preparation Example 1

A solution consisting of 80 parts by mass of polydimethylsiloxane having 0.5 mol % vinyl groups at molecular side chains with a number average molecular weight (Mn) of 30,000, and 400 parts by mass of isododecane was prepared. To the solution were added 3.0 parts of organohydrogenpolysiloxane shown by the formula (M-6) and 0.7 part of ethynylcyclohexanol, and then mixed. Furthermore, 0.5 part of a platinum catalyst CAT-PL-5 (available from Shin-Etsu Chemical Co., Ltd.) was added thereto, and the mixture was filtered through a 0.2-μm membrane filter to obtain a thermosetting siloxane polymer solution (C-1).

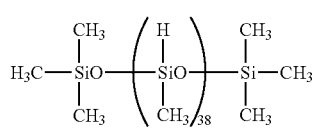

Resin Solution Preparation Example 2

A solution consisting of 60 parts by mass of polydimethylsiloxane having 0.5 mol % vinyl groups at molecular side chains with a number average molecular weight (Mn) of 30,000, 20 parts by mass of polydimethylsiloxane having 0.15 mol % vinyl groups at both terminal chains with a number average molecular weight (Mn) of 60,000, and 400 parts by mass of isododecane was prepared. To the solution were added 2.5 parts of organohydrogenpolysiloxane shown by the formula (M-6) and 0.7 part of ethynylcyclohexanol, and then mixed. Furthermore, 0.5 part of a platinum catalyst CAT-PL-5 (available from Shin-Etsu Chemical Co., Ltd.) was added thereto, and the mixture was filtered through a 0.2-μm membrane filter to obtain a thermosetting siloxane polymer solution (C-2).

Resin Solution Preparation Example 3

A solution consisting of 40 parts by mass of polydimethylsiloxane having 0.5 mol % vinyl groups at molecular side chains with a number average molecular weight (Mn) of 30,000, 40 parts by mass of polydimethylsiloxane having 0.15 mol % vinyl groups at both terminal chains with a number average molecular weight (Mn) of 60,000, and 400 parts by mass of isododecane was prepared. To the solution were added 2.0 parts of organohydrogenpolysiloxane shown by the formula (M-6) and 0.7 part of ethynylcyclohexanol, and then mixed. Furthermore, 0.5 part of a platinum catalyst CAT-PL-5 (available from Shin-Etsu Chemical Co., Ltd.) was added thereto, and the mixture was filtered through a 0.2-μm membrane filter to obtain a thermosetting siloxane polymer solution (C-3).

Examples 1 to 5 and Comparative Examples 1 to 3

Onto a 200-mm diameter silicon wafer (thickness: 725 μm) whose entire surface was formed with copper posts having height of 10 μm and diameter of 40 μm, the material of the layer (A) was applied by spin coating, and then heated with a hot plate at 180° C. for 5 minutes to form the layer (A) with a film thickness shown in Table 1 on the bump-formed surface of the wafer. Examples 1 to 3, 5 and Comparative Example 3 were subjected to an edge-cut treatment with isododecane after spin coating to remove the layer (A) at the wafer peripheral portion by a width shown in Table 1. On the other hand, the polymer solution of the layer (C) was first applied to a 200-mm diameter glass plate (thickness: 500 μm), which was used as the support, and then heated with a hot plate at 200° C. for 5 minutes to form the layer (C) with a film thickness shown in Table 1 on the glass support. Then, the polymer solution of the layer (B) was likewise applied to the layer (C) formed on the glass support by spin coating to form the layer (C) with a film thickness shown in Table 1. Then, the resultant was heated with the hot plate at 150° C. for 3 minutes. The silicon wafer having the thermoplastic organopolysiloxane polymer layer (A) and the glass plate having the layer (C) composed of the thermosetting siloxane polymer and the layer (B) on the layer (C) thus obtained were bonded so that the resin surfaces faced each other in a vacuum bonding apparatus under the conditions shown in Table 1. A laminate was thereby manufactured (under the pressure bonding condition).

In the above examples, the glass plate was used as the support for the purpose of visually observing abnormalities after bonding the substrate, but a substrate such as a wafer, which does not transmit light, can be used instead.

Thereafter, the bonded substrate was subjected to the following tests. The results of Examples and Comparative Examples are shown in Table 1. In addition, evaluations were carried out in order described below. When an anomaly appeared on the test (when the result was judged as "poor"), the evaluation thereafter was stopped.

—Adhesion Test—

The 200-mm wafer was bonded with a wafer-bonding apparatus EVG520IS manufactured by EV group. The bonding was carried out at adhesion temperature shown in Table 1, under a chamber internal pressure during bonding of $10^{-3}$ mbar or less, with a load of 5 kN. After bonding, the substrate was once heated with an oven at 180° C. for 1 hour to cure the layer (B) and the layer (C). After cooling to room temperature, the adhesion state of the interface was visually observed. When no abnormality like bubbles was found at the interface, the laminate was evaluated as good, and shown with "good". When an abnormality was found, the laminate was evaluated as poor, and shown with "poor".

—Back Surface Grinding Resistance Test—

The back surface of the silicon wafer was ground by a grinder (DAG810, manufactured by DISCO Co., Ltd.) with a diamond grinding wheel. After the wafer was ground to a final substrate thickness of 50 μm, abnormities such as crack and separation were checked with an optical microscope (100-folds). When no abnormality was found, the laminate was evaluated as good, and shown with "good", and when an abnormality was found, the laminate was evaluated as poor, and shown with "poor".

In Examples 2 to 4 and Comparative Example 3, after the back surface was ground, the wafer the back surface of which had been ground was diced with a dicer (manufactured by DISCO Co., Ltd.). The wafer was diced into chips with a size of 10 mm×10 mm such that the back-surface-ground wafer and the layer (A) were cut, the layer (B) was cut halfway, and the support was not cut. The laminates subjected to the dicing process were shown with "Yes" in Table 1.

—Heat Resistance Test—

After the back surface of the silicon wafer had been ground, the laminate was placed in an oven under nitrogen atmosphere at 200° C. for 2 hours, followed by heating with a hot plate at 260° C. for 10 minutes. Then, abnormalities in appearance of the laminate were checked. When no appearance abnormality was found, the laminate was evaluated as good, and shown with "good". When no appearance abnormality such as voids, blister of the wafer, and breakage of the wafer was found although the wafer has slight distortion, the laminate was evaluated as substantially good, and shown with "moderate". When appearance abnormality such as voids, blister of the wafer, and breakage of the wafer occurred, the laminate was evaluated as poor, and shown with "poor".

—Support Separation Test—Separation ability of the support was evaluated in the following manner. First, a dicing tape was bonded to the processed surface (non-circuit-forming surface) side of the wafer that had been thinned to 50 μm and subjected to the heat resistance test, with a dicing frame. This dicing tape surface was set to a suction plate by vacuum suction. Then, one point of the glass was lifted by tweezers at room temperature to separate the glass substrate. When it could be separated without cracking the 50-μm wafer, the laminate was shown with "good". When an abnormality such as cracking occurred, the laminate was evaluated as poor, and shown with "poor".

—Tape Peeling Test—

Tape peeling test was performed in the following manner. The dicing tape surface of the wafer, which had been subjected to the support separation test and previous tests, was continuously set to the suction plate by vacuum suction. Then, a polyester film adhesive tape No. 648, made of Teraoka Seisakusho Co., Ltd., was bonded to the uncovered polymer layer (B) to separate the polymer layer (B) from the wafer by tape peeling. When the layer was separated without cracking the 50-μm wafer, the laminate was shown with "good", and when an abnormality such as cracks occurred, the laminate was evaluated poor, and shown with "poor".

—Cleaning Removability Test—

After the tape peeling test, the 200-mm wafer (which had been exposed to the heat resistance test condition) mounted on the dicing frame via the dicing tape was set on a spin coater, with the adhesive layer upside. Isononane was then sprayed as a cleaning solution for 3 minutes, and the wafer was rinsed by spraying isopropyl alcohol (IPA) while the wafer was rotated. Thereafter, appearance of the wafer was observed, and residue of the adhesive material resin was visually checked. When no resin remained, the laminate was evaluated as good, and shown with "good". When the resin remained, the laminate was evaluated as poor, and shown with "poor".

—Peeling Force Test—

The polymer layer (C) was formed on the silicon wafer used as the support, and the polymer layer (B) was formed on the layer (C), under the same conditions as in Examples and Comparative Example. Thereafter, five polyimide tapes each having a length of 150 mm and a width of 25 mm were bonded thereto, and a part of the layer (B) to which no tape has been bonded was removed. 120 mm of the tapes were then peeled off from one end by 180° peeling with AUTOGRAPH (AG-1) manufactured by Shimadzu Co., and an average force applied at this time (120 mm stroke, 5 times) was measured as a peeling force of the temporary adhesive layer.

TABLE 1

| | | Example 1 | Example 2 | Example 3 | Example 4 | Example 5 | Comparative Example 1 | Comparative Example 2 | Comparative Example 3 |
|---|---|---|---|---|---|---|---|---|---|
| Manufacturing conditions | Resin layer (A) | A-1 | A-2 | A-2 | A-2 | A-1 | None | A-2 | A-2 |
| | Film thickness of layer (A) | 1 μm | 5 μm | 5 μm | 5 μm | 1 μm | — | 5 μm | 5 μm |
| | Edge-cut treatment of layer (A) | 3 mm | 3 mm | 3 mm | None | 3 mm | — | None | 3 mm |
| | Resin layer (B) | B-1 | B-2 | B-2 | B-2 | B-2 | B-1 | None | B-2 |
| | Film thickness of layer (B) | 30 μm | 50 μm | 100 μm | 50 μm | 50 μm | 30 μm | — | 100 μm |

TABLE 1-continued

|  |  | Example 1 | Example 2 | Example 3 | Example 4 | Example 5 | Comparative Example 1 | Comparative Example 2 | Comparative Example 3 |
|---|---|---|---|---|---|---|---|---|---|
|  | Resin layer (C) | C-1 | C-2 | C-3 | C-3 | C-2 | C-1 | C-2 | None |
|  | Film thickness of layer (C) | 5 μm | 5 μm | 5 μm | 10 μm | 2 μm | 5 μm | 5 μm | — |
|  | Layer (C) peeing force | 5 gf | 10 gf | 20 gf | 40 gf | 5 gf | 5 gf | 10 gf | — |
|  | Adhesion temperature | 150° C. | 120° C. | 120° C. | 120° C. | 120° C. | 150° C. | 150° C. | 120° C. |
|  | Dicing process | None | Yes | Yes | Yes | None | None | — | Yes |
| Results | Adhesion | Good | Good | Good | Good | Good | Good | Poor | Good |
|  | Back surface grinding resistance | Good | Good | Good | Good | Good | Good | — | Good |
|  | Heat resistance | Good | Good | Good | Good | Good | Good | — | Good |
|  | Support separation ability | Good | Good | Good | Good | Good | Good | — | Poor |
|  | Tape peeling performance | Good | Good | Good | Good | Good | Poor | — | — |
|  | Cleaning removability | Good | Good | Good | Good | Good | — | — | — |

As shown in Table 1, it could be clarified that Examples 1 to 5, which satisfy the requirements of the present invention, facilitated temporary adhesion and separation. In particular, Examples 2 to 4 demonstrated that the wafer could be diced before separation without problems such as chip flying, and could be easily separated even when the thin wafer was cut before separation. Moreover, in Examples 1 to 5, the wafer did not slip at the time of grinding the wafer because the peeling force ranged from 5 to 40 gf.

On the other hand, Comparative Example 1, in which the layer (A) was not formed in contrast with Example 1, failed to remove the layer (B) remaining on the polished wafer by tape peeling. Moreover, Comparative Example 2, in which the layer (B) was not formed in contrast with Example 2, failed to bonding. Furthermore, Comparative Example 3, in which the layer (C) was not formed in contrast with Example 3, failed to separate the support. Thus, it was revealed that all the three layers were required to accomplish the whole processes.

It should be noted that the present invention is not limited to the foregoing embodiments. The embodiments are just exemplification, and any examples that have substantially the same feature and demonstrate the same functions and effects as those in the technical concept described in claims of the present invention are included in the technical scope of the present invention.

The invention claimed is:

1. A wafer processing laminate comprising a support, a temporary adhesive material layer formed on the support, and a wafer laminated on the temporary adhesive material layer, the wafer having a front surface on which a circuit is formed and a back surface to be processed, wherein
the temporary adhesive material layer comprises a complex temporary adhesive material layer having a three-layered structure that includes a first temporary adhesive layer composed of a thermoplastic organopolysiloxane polymer layer (A) releasably adhering to the front surface of the wafer, a second temporary adhesive layer composed of a thermosetting siloxane-modified polymer layer (B) releasably laminated on the first temporary adhesive layer, and a third temporary adhesive layer composed of a thermosetting siloxane polymer layer (C) releasably laminated on the second temporary adhesive layer and releasably adhering to the support.

2. The wafer processing laminate according to claim 1, wherein the thermoplastic organopolysiloxane polymer layer (A) is a layer of an unreactive organopolysiloxane containing 99.000 to 99.999 mol % of a siloxane unit (D unit) shown by $R^{11}R^{12}SiO_{2/2}$, 1.000 to 0.001 mol % of a siloxane unit (M unit) shown by $R^{13}R^{14}R^{15}SiO_{1/2}$, and 0.000 to 0.500 mol % of a siloxane unit (T unit) shown by $R^{16}SiO_{3/2}$, where $R^{11}$, $R^{12}$, $R^{13}$, $R^{14}$, $R^{15}$, and $R^{16}$ each represent an unsubstituted or substituted monovalent hydrocarbon group, the unreactive organopolysiloxane having a weight average molecular weight of 200,000 to 1,000,000 and containing 0.5 mass % or less of a low molecular weight component having a molecular weight of 740 or less.

3. The wafer processing laminate according to claim 1, wherein the thermosetting siloxane-modified polymer layer (B) is a cured layer of a composition containing 100 parts by mass of a siloxane bond-containing polymer having a repeating unit shown by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

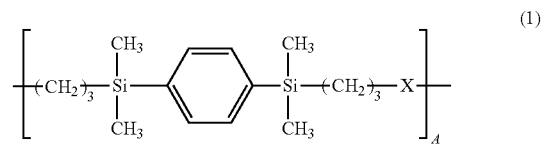

-continued

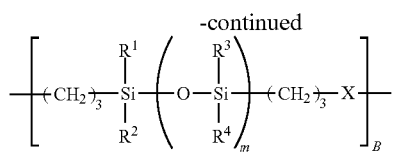

wherein $R^1$ to $R^4$ may be the same or different, and represent a monovalent hydrocarbon group having 1 to 8 carbon atoms; "m" is an integer of 1 to 100; B is a positive number; A is 0 or a positive number; and X is a divalent organic group shown by the following general formula (2),

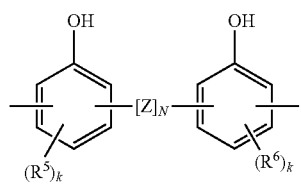 (2)

wherein Z represents a divalent organic group selected from any of

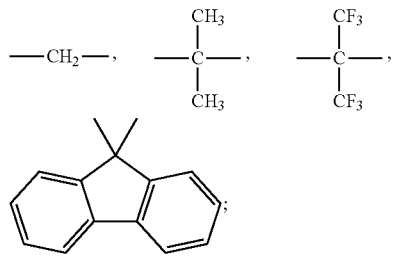

N represents 0 or 1; $R^5$ and $R^6$ each represent an alkyl or alkoxy group having 1 to 4 carbon atoms, and may be the same or different from each other; and "k" represents any of 0, 1, and 2.

4. The wafer processing laminate according to claim 1, wherein the thermosetting siloxane-modified polymer layer (B) is a cured layer of a composition containing 100 parts by mass of a siloxane bond-containing polymer having a repeating unit shown by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

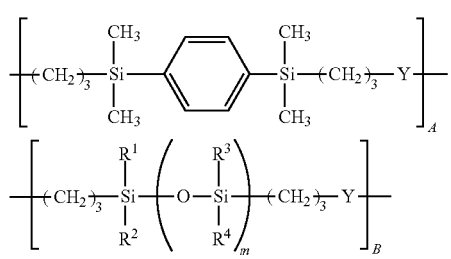 (3)

wherein $R^1$ to $R^4$ may be the same or different, and represent a monovalent hydrocarbon group having 1 to 8 carbon atoms; "m" is an integer of 1 to 100; B is a positive number; A is 0 or a positive number; and Y is a divalent organic group shown by the following general formula (4),

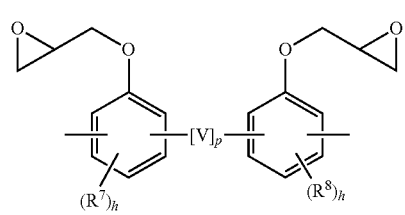 (4)

wherein V represents a divalent organic group selected from any of

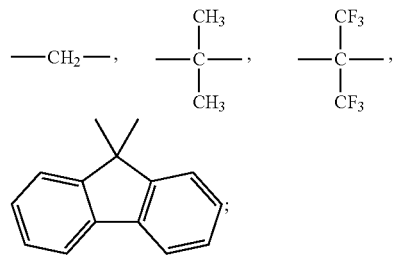

"p" represents 0 or 1; $R^7$ and $R^8$ each represent an alkyl or alkoxy group having 1 to 4 carbon atoms, and may be the same or different from each other; and "h" represents any of 0, 1, and 2.

5. The wafer processing laminate according to claim 1, wherein the thermosetting siloxane polymer layer (C) is a cured layer of a composition containing:
(C-1) an organopolysiloxane having two or more alkenyl groups per molecule;
(C-2) an organohydrogenpolysiloxane having two or more silicon-bonded hydrogen atoms (Si—H groups) per molecule, in such an amount that a mole ratio of the Si—H group in the component (C-2) to the alkenyl group in the component (C-1) ranges from 0.3 to 10; and
(C-3) a platinum-based catalyst.

6. The wafer processing laminate according to claim 5, wherein the thermosetting siloxane polymer layer (C) further contains (C-4) a reaction retarder in an amount of 0.1 to 10 parts by mass based on 100 parts by mass of a total of the component (C-1) and the component (C-2).

7. The wafer processing laminate according to claim 1, wherein the thermosetting siloxane-modified polymer layer (B) laminated on the thermosetting siloxane polymer layer (C) exhibits a peeing force of 2 to 50 gf when the polymer layer (B) is interfacially peeled from the polymer layer (C) after heat curing, the peeling force being measured by 180° peeling using a test piece having a width of 25 mm.

8. The wafer processing laminate according to claim 1, wherein the thermoplastic organopolysiloxane polymer layer (A) is formed on a partial surface of the wafer and releasably adheres to the partial surface.

9. A method for manufacturing a thin wafer comprising the steps of:
(a) bonding a support and a circuit-forming front surface of a wafer that has the circuit-forming front surface and a non-circuit-forming back surface through a complex temporary adhesive material layer used for the wafer processing laminate according to claim 1, the complex temporary adhesive material layer including the thermoplastic organopolysiloxane polymer layer (A), the thermosetting siloxane-modified polymer layer (B), and the thermosetting siloxane polymer layer (C), wherein the bonding is performed by forming the thermosetting siloxane polymer layer (C) on the support, forming the thermosetting siloxane-modified polymer layer (B) on the polymer layer (C), and then bonding the support, on which the polymer layers (B) and (C) have been formed, to the wafer on which a circuit and the polymer layer (A) have been formed, under vacuum;
(b) heat curing the polymer layers (B) and (C);
(c) grinding or polishing the non-circuit-forming back surface of the wafer bonded to the support;
(d) processing the non-circuit-forming back surface of the wafer;
(e) separating the support and the thermosetting siloxane polymer layer (C) laminated on the support together from the processed wafer; and
(f) separating the thermosetting siloxane-modified polymer layer (B) from the wafer after the step (e).

10. A method for manufacturing a thin wafer comprising the steps of:
(a) bonding a support and a circuit-forming front surface of a wafer that has the circuit-forming front surface and a non-circuit-forming back surface through a complex temporary adhesive material layer used for the wafer processing laminate according to claim 1, the complex temporary adhesive material layer including the thermoplastic organopolysiloxane polymer layer (A), the thermosetting siloxane-modified polymer layer (B), and the thermosetting siloxane polymer layer (C), wherein the bonding is performed by forming the thermoplastic organopolysiloxane polymer layer (A) on the wafer on which a circuit has been formed, forming the thermosetting siloxane-modified polymer layer (B) on the polymer layer (A), and then bonding the circuit-formed wafer, on which the polymer layers (A) and (B) have been formed, to the support on which the polymer layer (C) has been formed, under vacuum;
(b) heat curing the polymer layers (B) and (C);
(c) grinding or polishing the non-circuit-forming back surface of the wafer bonded to the support;
(d) processing the non-circuit-forming back surface of the wafer;
(e) separating the support and the thermosetting siloxane polymer layer (C) laminated on the support together from the processed wafer; and
(f) separating the thermosetting siloxane-modified polymer layer (B) from the wafer after the step (e).

11. The method for manufacturing a thin wafer according to claim 9, wherein, in the step (a), the thermoplastic organopolysiloxane polymer layer (A) is formed on the circuit-formed wafer except for a peripheral portion.

12. The method for manufacturing a thin wafer according to claim 10, wherein, in the step (a), the thermoplastic organopolysiloxane polymer layer (A) is formed on the circuit-formed wafer except for a peripheral portion.

13. A temporary adhesive material for a wafer processing, the temporary adhesive material being used for temporarily bonding a support and a wafer having a front surface on which a circuit is formed and a back surface to be processed, comprising
a complex temporary adhesive material layer having a three-layered structure that includes a first temporary adhesive layer composed of a thermoplastic organopolysiloxane polymer layer (A) capable of releasably adhering to the front surface of the wafer, a second temporary adhesive layer composed of a thermosetting siloxane-modified polymer layer (B) releasably laminated on the first temporary adhesive layer, and a third temporary adhesive layer composed of a thermosetting siloxane polymer layer (C) releasably laminated on the second temporary adhesive layer and capable of releasably adhering to the support.

14. The temporary adhesive material for a wafer processing according to claim 13, wherein the thermoplastic organopolysiloxane polymer layer (A) is a layer of an unreactive organopolysiloxane containing 99.000 to 99.999 mol % of a siloxane unit (D unit) shown by $R^{11}R^{12}SiO_{2/2}$, 1.000 to 0.001 mol % of a siloxane unit (M unit) shown by $R^{13}R^{14}R^{15}SiO_{1/2}$, and 0.000 to 0.500 mol % of a siloxane unit (T unit) shown by $R^{16}SiO_{3/2}$, where $R^{11}$, $R^{12}$, $R^{13}$, $R^{14}$, $R^{15}$ and $R^{16}$ each represent an unsubstituted or substituted monovalent hydrocarbon group, the unreactive organopolysiloxane having a weight average molecular weight of 200,000 to 1,000,000 and containing 0.5 mass % or less of a low molecular weight component having a molecular weight of 740 or less.

15. The temporary adhesive material for a wafer processing according to claim 13, wherein the thermosetting siloxane-modified polymer layer (B) is a cured layer of a composition containing 100 parts by mass of a siloxane bond-containing polymer having a repeating unit shown by the following general formula (1) and a weight average molecular weight of 3,000 to 500,000, and 0.1 to 50 parts by mass of one or more crosslinkers selected from the group consisting of an amino condensate, a melamine resin, a urea resin each modified with formalin or formalin-alcohol, a phenol compound having on average two or more methylol or alkoxymethylol groups per molecule, and an epoxy compound having on average two or more epoxy groups per molecule,

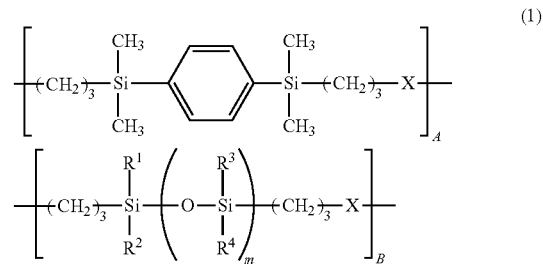

(1)

wherein $R^1$ to $R^4$ may be the same or different, and represent a monovalent hydrocarbon group having 1 to 8 carbon atoms; "m" is an integer of 1 to 100; B is a positive number; A is 0 or a positive number; and X is a divalent organic group shown by the following general formula (2),

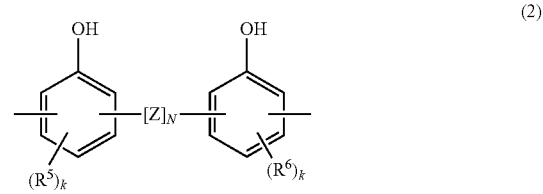

(2)

wherein Z represents a divalent organic group selected from any of

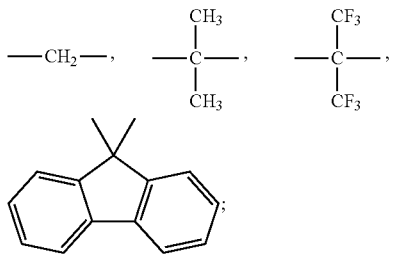

N represents 0 or 1; $R^5$ and $R^6$ each represent an alkyl or alkoxy group having 1 to 4 carbon atoms, and may be the same or different from each other; and "k" represents any of 0, 1, and 2.

16. The temporary adhesive material for a wafer processing according to claim 13, wherein the thermosetting siloxane-modified polymer layer (B) is a cured layer of a composition containing 100 parts by mass of a siloxane bond-containing polymer having a repeating unit shown by the following general formula (3) and a weight average molecular weight of 3,000 to 500,000, and 0.1 to 50 parts by mass of one or more crosslinkers selected from the group consisting of a phenol compound having on average two or more phenol groups per molecule and an epoxy compound having on average two or more epoxy groups per molecule,

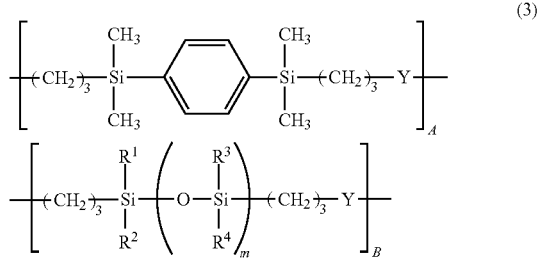

wherein $R^1$ to $R^4$ may be the same or different, and represent a monovalent hydrocarbon group having 1 to 8 carbon atoms; "m" is an integer of 1 to 100; B is a positive number; A is 0 or a positive number; and Y is a divalent organic group shown by the following general formula (4),

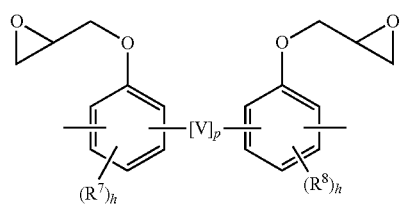

wherein V represents a divalent organic group selected from any of

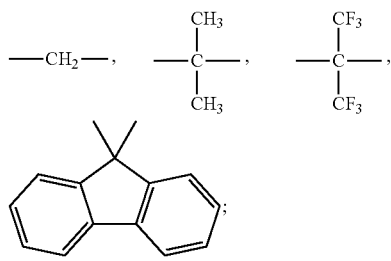

"p" represents 0 or 1; $R^7$ and $R^8$ each represent an alkyl or alkoxy group having 1 to 4 carbon atoms, and may be the same or different from each other; and "h" represents any of 0, 1, and 2.

17. The temporary adhesive material for a wafer processing according to claim 13, wherein the thermosetting siloxane polymer layer (C) is a cured layer of a composition containing:
(C-1) an organopolysiloxane having two or more alkenyl groups per molecule;
(C-2) an organohydrogenpolysiloxane having two or more silicon-bonded hydrogen atoms (Si—H groups) per molecule, in such an amount that a mole ratio of the Si—H group in the component (C-2) to the alkenyl group in the component (C-1) ranges from 0.3 to 10; and
(C-3) a platinum-based catalyst.

18. The temporary adhesive material for a wafer processing according to claim 17, wherein the thermosetting siloxane polymer layer (C) further contains (C-4) a reaction retarder in an amount of 0.1 to 10 parts by mass based on 100 parts by mass of a total of the component (C-1) and the component (C-2).

19. The temporary adhesive material for a wafer processing according to claim 13, wherein the thermosetting siloxane-modified polymer layer (B) laminated on the thermosetting siloxane polymer layer (C) exhibits a peeing force of 2 to 50 gf when the polymer layer (B) is interfacially peeled from the polymer layer (C) after heat curing, the peeling force being measured by 180° peeling using a test piece having a width of 25 mm.

20. The temporary adhesive material for a wafer processing according to claim 13, wherein a peripheral portion of the thermoplastic organopolysiloxane polymer layer (A) is partially removed.

21. The method for manufacturing a thin wafer according to claim 11, wherein, in the step (d), cutting the thinned circuit-formed wafer of the thinned wafer processing laminate obtained in the step (c) without cutting the support, such that the thinned wafer is cut into chips before the separating step (e).

* * * * *